US010766431B2

(12) United States Patent
Koshiba et al.

(10) Patent No.: US 10,766,431 B2
(45) Date of Patent: Sep. 8, 2020

(54) IMAGING APPARATUS AND VEHICLE

(71) Applicant: KYOCERA Corporation, Kyoto (JP)

(72) Inventors: Yasushi Koshiba, Yokohama (JP);
Hiroshi Okada, Yokohama (JP);
Makoto Suzuki, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 67 days.

(21) Appl. No.: 15/320,154

(22) PCT Filed: Jun. 24, 2015

(86) PCT No.: PCT/JP2015/003177
§ 371 (c)(1),
(2) Date: Dec. 19, 2016

(87) PCT Pub. No.: WO2015/198598
PCT Pub. Date: Dec. 30, 2015

(65) Prior Publication Data
US 2017/0129418 A1      May 11, 2017

(30) Foreign Application Priority Data

Jun. 26, 2014 (JP) ................. 2014-131782
Jun. 26, 2014 (JP) ................. 2014-131785

(51) Int. Cl.
*B60R 11/04* (2006.01)
*B60R 1/00* (2006.01)
(Continued)

(52) U.S. Cl.
CPC .............. *B60R 11/04* (2013.01); *B60K 35/00* (2013.01); *B60R 1/00* (2013.01); *G03B 17/02* (2013.01);
(Continued)

(58) Field of Classification Search
CPC ..... B60R 11/04; B60R 1/00; B60R 2011/004; B60R 2300/202; B60R 2300/301;
(Continued)

(56) References Cited

U.S. PATENT DOCUMENTS 8,095,001 B2    1/2012   Sasaki
8,917,507 B2   12/2014   Nagasawa
(Continued)

FOREIGN PATENT DOCUMENTS

EP    2 393 277 A1    7/2011
JP    S631242140 A    5/1988
(Continued)

OTHER PUBLICATIONS

International Search Report issued in PCT/JP2015/003177; dated Sep. 29, 2015.
(Continued)

*Primary Examiner* — Joseph G Ustaris
*Assistant Examiner* — Jimmy S Lee
(74) *Attorney, Agent, or Firm* — Studebaker & Brackett PC

(57) ABSTRACT

Provided is an imaging apparatus (10) including an imaging optical system (20), an image sensor (31), one or more circuit boards including at least one of the image sensor and an electronic component mounted thereon, a housing (11) including an opening that exposes the imaging optical system to a subject and supporting the imaging optical system, the image sensor, and the one or more circuit boards, a signal terminals (41) that transmit an image signal of the subject image captured by the image sensor to an outside of the housing, and a heat transfer unit (44) having heat conductivity connected to the plurality of terminals, the heat
(Continued)

transfer unit that transfers heat generated from at least one of the image sensor and the electronic component to the plurality of terminals.

15 Claims, 2 Drawing Sheets

(51) Int. Cl.
| | | |
|---|---|---|
| *H04N 5/225* | (2006.01) | |
| *G03B 17/02* | (2006.01) | |
| *G03B 17/55* | (2006.01) | |
| *B60K 35/00* | (2006.01) | |
| *H04N 7/18* | (2006.01) | |
| *H05K 7/20* | (2006.01) | |
| *B60R 11/00* | (2006.01) | |

(52) U.S. Cl.
CPC ............. *G03B 17/55* (2013.01); *H04N 5/225* (2013.01); *H04N 5/2252* (2013.01); *H04N 5/2253* (2013.01); *H04N 5/2254* (2013.01); *H04N 7/183* (2013.01); *H05K 7/20445* (2013.01); *B60K 2370/152* (2019.05); *B60K 2370/21* (2019.05); *B60R 2011/004* (2013.01); *B60R 2300/202* (2013.01); *B60R 2300/301* (2013.01); *B60R 2300/80* (2013.01); *B60Y 2400/92* (2013.01)

(58) Field of Classification Search
CPC ................ B60R 2300/80; B60K 35/00; B60K 2350/106; B60K 2350/2013; G03B 17/02; G03B 17/55; H04N 5/225; H04N 5/2252; H04N 5/2254; H04N 7/183; H04N 7/20445; B60Y 2400/92
USPC ........................................................ 348/148
See application file for complete search history.

(56) References Cited

U.S. PATENT DOCUMENTS

| | | | |
|---|---|---|---|
| 8,970,700 | B2 | 3/2015 | Inoue et al. |
| 9,628,731 | B2 | 4/2017 | Kang et al. |
| 2004/0169771 | A1* | 9/2004 | Washington ......... H04N 5/2251 348/374 |
| 2005/0093014 | A1* | 5/2005 | Seki ....................... H04N 9/315 257/100 |
| 2006/0285226 | A1* | 12/2006 | Senba .................... G02B 7/008 359/694 |
| 2009/0060492 | A1 | 3/2009 | Sasaki |
| 2009/0086417 | A1* | 4/2009 | Hasegawa .............. G03B 17/02 361/679.01 |
| 2011/0298925 | A1* | 12/2011 | Inoue ................... H04N 5/2251 348/148 |
| 2012/0033385 | A1 | 2/2012 | Nagasawa |
| 2012/0075446 | A1* | 3/2012 | Nakamura ............. H04N 7/183 348/65 |
| 2013/0093948 | A1* | 4/2013 | Takeshita ............. H04N 5/2253 348/374 |
| 2014/0168507 | A1* | 6/2014 | Renaud ................ H04N 5/2257 348/373 |
| 2015/0358564 | A1 | 12/2015 | Kang et al. |

FOREIGN PATENT DOCUMENTS

| | | |
|---|---|---|
| JP | 2006-217061 A | 8/2006 |
| JP | 2006-319134 A | 11/2006 |
| JP | 2007-022364 A | 2/2007 |
| JP | 2009-055260 A | 3/2009 |
| JP | 2010-050771 A | 3/2010 |
| JP | 2010-226227 A | 10/2010 |
| JP | 2010-267945 A | 11/2010 |
| JP | 2011-259101 A | 12/2011 |
| JP | 2013-034082 A | 2/2013 |
| KR | 10-1391176 B1 | 5/2014 |
| WO | 2013150621 A1 | 10/2013 |

OTHER PUBLICATIONS

Written Opinion issued in PCT/JP2015/003177; dated Sep. 29, 2015; with English language Concise Explanation.
Extended European Search Report (EESR) dated Jan. 16, 2018, from corresponding EP Appl No. 15812030.3, 8 pp.

* cited by examiner

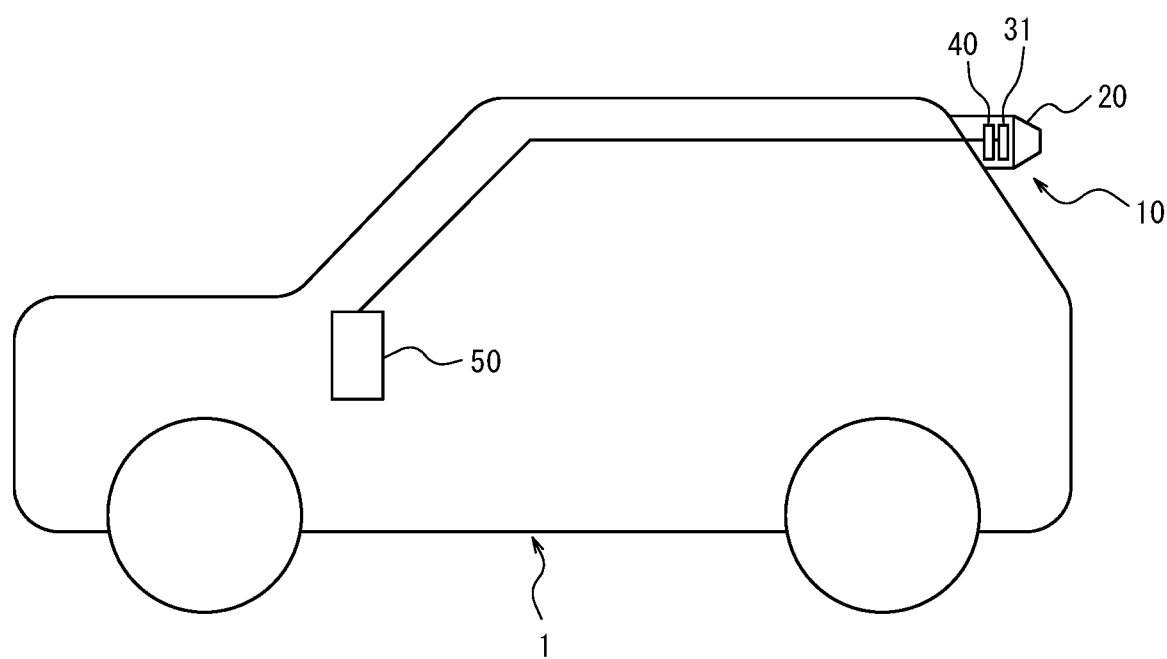

IMAGING APPARATUS AND VEHICLE

CROSS REFERENCE TO RELATED APPLICATIONS

This application claims priority to and the benefit of Japanese Patent Applications No. 2014-131782 and No. 2014-131785 both filed on Jun. 26, 2014, the entire contents of which are incorporated herein by reference.

TECHNICAL FIELD

This disclosure relates to an imaging apparatus mounted on a vehicle and the like and also to the vehicle.

BACKGROUND

There is conventionally known an imaging apparatus having an electronic circuit unit which includes an image sensor. In recent years, also, a small-sized imaging apparatus including, as a package, an imaging optical system (including an optical element such as a lens) for forming a subject image captured by the image sensor is popularly used. The imaging apparatus has been considered to be widely applied to, for example, a vehicle-mounted camera for assisting visibility of a driver of a vehicle, a surveillance camera used for the purpose of security, and the like and required to become smaller while securing performance thereof.

Generally, the imaging apparatus, in order to secure performance of the electronic circuit unit, is desired to suppress temperature rise of the electronic circuit unit. Therefore, a configuration of the imaging apparatus capable of efficiently relieving heat of the electronic circuit unit has been considered.

For example, PLT 1 set forth below discloses a configuration aiming at space saving by electrically connecting an electromagnetic shield circumferential wall surrounding an image sensor substrate to an external connector such that the electromagnetic shield circumferential wall functions as a radiator as well.

Also, PLT 2 set forth below discloses a configuration including, in order to improve heat dissipation efficiency, a soft material abutting on an outer peripheral surface of an electronic circuit unit having the image sensor, and a plate portion abutting on the soft material and an inner peripheral wall surface of an accommodation member (a housing).

CITATION LIST

Patent Literature

PLT 1: JP-A-2007-022364
PLT 2: JP-A-2011-259101

SUMMARY

Solution to Problem

In order to solve the above problem, an imaging apparatus according to a first aspect of the disclosure herein includes:
 an imaging optical system;
 an image sensor for capturing a subject image formed through the imaging optical system;
 one or more circuit boards having at least one of the image sensor and an electronic component mounted thereon;
 a housing having an opening for exposing the imaging optical system to a subject, the housing for supporting the imaging optical system, the image sensor, and the one or more circuit boards;
 a signal connection unit having a plurality of terminals for transmitting an image signal of the subject image captured by the image sensor to an outside of the housing; and
 a heat transfer unit having insulating properties and connected to the plurality of terminals, the heat transfer unit for transferring heat generated from at least one of the image sensor and the electronic component to the plurality of terminals.

Also, a vehicle according to a second aspect of the disclosure herein has an imaging apparatus mounted thereon, the imaging apparatus including an imaging optical system, an image sensor for capturing a subject image formed through the imaging optical system, one or more circuit boards having at least one of the image sensor and an electronic component mounted thereon, a housing having an opening for exposing the imaging optical system to a subject, the housing for supporting the imaging optical system, the image sensor, and the one or more circuit boards, a signal connection unit including a plurality of terminals for transmitting an image signal of the subject image captured by the image sensor to an outside of the housing, and a heat transfer unit having insulating properties and connected to the plurality of terminals, the heat transfer unit for transferring heat generated from at least one of the image sensor and the electronic component to the plurality of terminals.

In order to solve the above problem, an imaging apparatus according to a third aspect of the disclosure herein includes:
 an imaging optical system;
 an image sensor for capturing a subject image formed through the imaging optical system;
 one or more circuit boards having at least one of the image sensor and an electronic component mounted thereon; and
 a housing having an opening for exposing the imaging optical system to a subject, the housing for supporting the imaging optical system, the image sensor, and the one or more circuit boards, wherein
 a first heat transfer member is integrally formed with an inner wall of the housing in such a manner as to extend from any one of the circuit boards into a direction remote from the imaging optical system.

Also, a vehicle according to a fourth aspect of the disclosure herein has an imaging apparatus mounted thereon, the imaging apparatus including an imaging optical system, an image sensor for capturing a subject image formed through the imaging optical system, one or more circuit boards having at least one of the image sensor and an electronic component mounted thereon, and a housing having an opening for exposing the imaging optical system to a subject, the housing for supporting the imaging optical system, the image sensor, and the one or more circuit boards, wherein a first heat transfer member is integrally formed with an inner wall of the housing in such a manner as to extend from any one of the circuit boards into a direction remote from the imaging optical system.

BRIEF DESCRIPTION OF THE DRAWINGS

In the accompanying drawings:
FIG. 1 is an arrangement diagram illustrating a mounting position of an imaging apparatus on a vehicle according to a first embodiment.

DETAILED DESCRIPTION

Figure 2A:
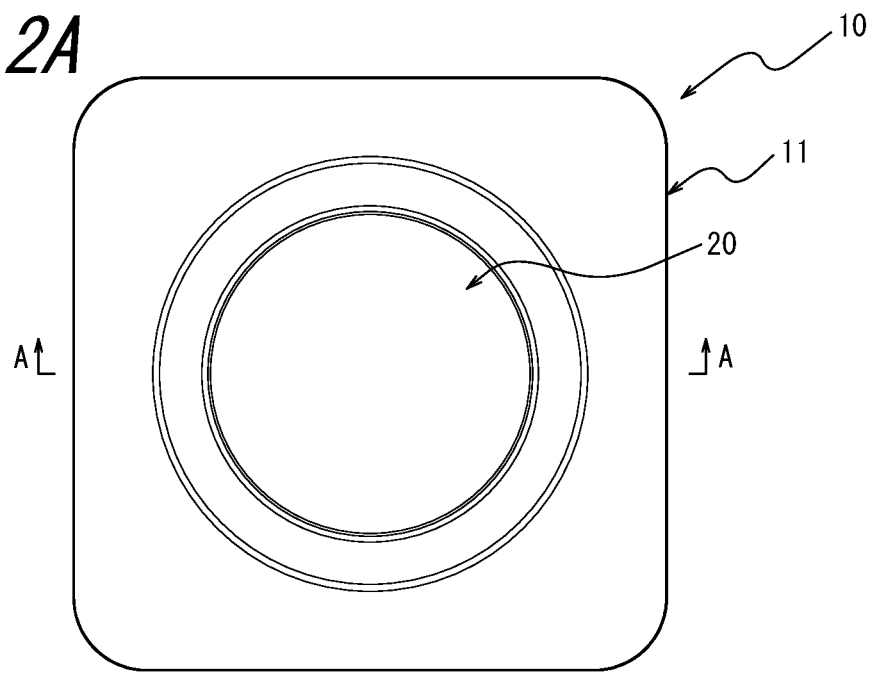
FIG. 2A is a plan view of the imaging apparatus of FIG. 1 viewed from an imaging optical system side.

Recently, however, an amount of heat released by the driving of the image sensor and a peripheral circuit has been increased accompanying a demand for more pixels and higher performance of the imaging apparatus. On the other hand, since a monitoring camera such as a vehicle camera and the like is often required to be small and, simultaneously, to have waterproof properties, heat dissipation from a closed narrow space has become more difficult. Therefore, a further improvement in the heat dissipation than the techniques disclosed in the PLT 1 and the PLT 2 has been required.

It could be helpful to provide an imaging apparatus capable of further enhancing a heat dissipation effect from an inside of the housing to an outside, and a vehicle.

The imaging apparatus and the vehicle of the disclosure herein may further enhance a heat dissipation effect from an inside of the housing to the outside.

(Mounting Imaging Apparatus on Vehicle)

Hereinafter, an embodiment of the disclosure herein will be described with reference to the drawings.

First, an imaging apparatus of the present embodiment will be described. FIG. 1 is an arrangement diagram illustrating a mounting position of an imaging apparatus 10 on a vehicle 1 according to the present embodiment. The imaging apparatus 10 is, for example, an on-vehicle camera. Also, the vehicle 1 is a vehicle such as, for example, an automobile.

As illustrated in FIG. 1, the imaging apparatus 10 including an imaging optical system 20 is mounted on the vehicle 1 together with a display apparatus 50. According to the present embodiment, the imaging apparatus 10 is fixed to, for example, an external rear portion of the vehicle 1 in order to capture a surrounding image of a rear view. The display apparatus 50 is provided in a visible manner from a driver's seat.

The imaging optical system 20 forms a subject image behind the vehicle 1 in an image sensor 31 inside the imaging apparatus 10. The imaging apparatus 10 controls the image sensor 31 to capture the subject image and generates an image signal. Also, the imaging apparatus 10 outputs the image signal to the display apparatus 50 via a signal connection unit 40. The display apparatus 50 displays the subject image corresponding to the image signal obtained from the signal connection unit 40.

(Configuration of Imaging Apparatus)

Figure 2B:
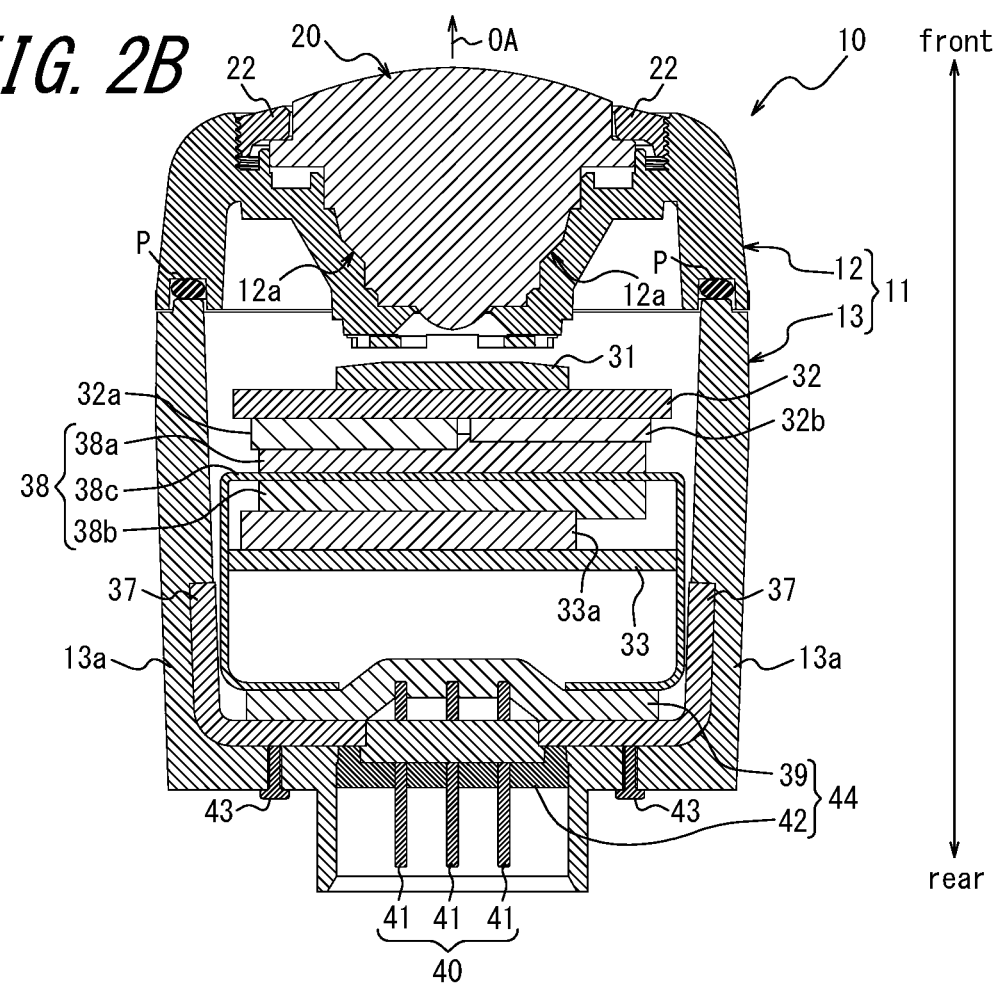
FIG. 2B is a cross-sectional view taken from line A-A of the imaging apparatus illustrated in FIG. 2A.

FIG. 2A illustrates a plan view of an imaging optical system side of the imaging apparatus 10 according to the present embodiment. Also, FIG. 2B is a cross-sectional view taken from line A-A of the imaging apparatus 10 illustrated in FIG. 2A. Hereinafter, viewing in a direction along an imaging optical axis OA of the imaging optical system 20 of FIG. 2B, a direction directing from the imaging apparatus 10 to a subject (a direction indicated by an arrow of the imaging optical axis OA) will be referred to as a direction directing from "rear" to "front".

A configuration of the imaging apparatus 10 will be described in detail with reference to the cross-sectional view of FIG. 2B. The imaging apparatus 10 includes the imaging optical system 20, the image sensor 31, at least one circuit board (for example, a first circuit board 32 and a second circuit board 33 in the present embodiment), a housing 11, a first heat transfer member 37, a second heat transfer member 38, the signal connection unit 40, an insertion member 43, and a heat transfer unit 44.

The imaging optical system 20 includes at least one optical element and is designed and formed in such a manner as to meet desired optical properties such as a focal length, a focal depth, and the like. In the present embodiment, the imaging optical system 20 is accommodated in a support opening 12a of the housing 11. A retainer member 22 presses the imaging optical system 20 rearward, thereby preventing the imaging optical system 20 inserted into the support opening 12a from falling off from the opening. The retainer member 22 may have a screw groove in a rear end portion thereof. Note that, although individual optical elements of the imaging optical system 20 are omitted in FIG. 2B, the imaging optical system 20 includes the optical elements such as a lens, a diaphragm, and the like to meet the desired optical properties.

The image sensor 31 is disposed behind the imaging optical system 20 and captures the subject image formed on a light receiving surface through the imaging optical system 20, converts the subject image into an electrical signal, and outputs the electrical signal. The image sensor 31 may be, for example, a CCD (Charge Coupled Device) image sensor, a CMOS (Complementary Metal Oxide Semiconductor) image sensor, or the like. The imaging apparatus 10 controls the signal connection unit 40, which will be described later, to transmit the image signal based on the electrical signal from the image sensor 31 to an outside of the housing 11. The image signal may be an electrical signal itself output from the image sensor 31, or a signal subjected to necessary image processing by an electronic component described later.

The at least one circuit board has at least one of the image sensor 31 and the electronic component mounted thereon. The electronic component is, for example, a component for driving the image sensor 31 or performing signal processing to the image signal. The at least one circuit board may be one or a plurality of circuit boards meeting a size constraint to be accommodated within the housing 11. The imaging apparatus 10 of the present embodiment includes the first circuit board 32 and the second circuit board 33. The first circuit board 32 has the image sensor 31 mounted on a surface thereof facing the imaging optical system 20, and electronic components 32a and 32b mounted on an opposite surface. Further, the second circuit board 33 has an electronic component 33a mounted on a surface thereof facing the first circuit board 32.

The housing 11 has an opening for exposing the imaging optical system 20 to the subject and supporting the imaging optical system 20. The housing 11 accommodates and supports the image sensor 31 and the circuit board(s). In the present embodiment, the housing 11 includes a front casing 12 and a rear casing 13. The front casing 12 supports the optical elements constituting the imaging optical system 20 in such a manner as to define a predetermined positional relationship. The rear casing 13 accommodates and supports the circuit board(s) together with the image sensor 31. In particular, the rear casing 13 supports the image sensor 31 at an image-forming position of the imaging optical system 20. In the present embodiment, the front casing 12 and the rear casing 13 are joined together with a packing P made of rubber, resin, or the like interposed therebetween. At this time, the packing P functions as a hermetic seal, and therefore the housing 11 of the imaging apparatus 10 forms a sealing structure.

The first heat transfer member 37, in the present embodiment, is integrally formed with an inner wall of the rear casing 13 of the housing 11 in such a manner as to extend from the second circuit board 33 into a direction remote from the imaging optical system 20. The first heat transfer member 37 extends from a lateral side portion of the housing 11 to a bottom portion thereof. To the first heat transfer member 37, heat generated from at least one of the image sensor 31 and electronic components 32a, 32b, and 33a is transferred via the second heat transfer member 38 described later. The first heat transfer member 37 has a temperature gradient within the housing 11 as described later and has a function to dissipate the heat from a thin portion 13a of the lateral side portion and the bottom portion. Further, in the housing 11 of the imaging apparatus 10 of the present embodiment, a thickness of a resin member in a portion having the first heat transfer member 37 integrally formed therewith is smaller than that in a portion where the first heat transfer member 37 is not integrally formed therewith. That is, the housing 11 has a thin portion 13a in which a thickness of the resin member is smaller as much as a thickness of the first heat transfer member 37.

The second heat transfer member 38 is a member for transferring the heat generated from the image sensor 31 and the like to the first heat transfer member 37. In the present embodiment, the second heat transfer member 38 includes heat transfer sheets 38a and 38b and a heat transfer plate 38c. The heat transfer sheet 38a connects the electronic components 32a and 32b mounted on the first circuit board 32 and the heat transfer plate 38c. The heat transfer sheet 38a transfers the heat generated from the image sensor 31 and the electronic components 32a and 32b to the heat transfer plate 38c. The heat transfer sheet 38b connects the electronic component 33a mounted on the second circuit board 33 and the heat transfer plate 38c. The heat transfer sheet 38b transfers the heat generated from the electronic component 33a to the heat transfer plate 38c. The heat transfer plate 38c transfers the heat from the heat transfer sheets 38a and 38b to the first heat transfer member 37 located in close proximity. When the heat transfer plate 38c is in direct contact with the first heat transfer member 37, the heat may be more efficiently transferred to the first heat transfer member 37. In the present embodiment, the heat transfer plate 38c may transfer the heat also to an internal heat transfer member 39. The heat transferred to the internal heat transfer member 39 is further transferred to the first heat transfer member 37 or, as described later, a plurality of terminals 41.

The signal connection unit 40 has heat conductivity and transmits the image signal of the subject image captured by the image sensor 31 to the outside of the housing 11. In the present embodiment, the signal connection unit 40 includes the plurality of terminals 41.

The insertion member 43 has the heat conductivity and is inserted from the outside of the housing 11 and in contact with a portion of the first heat transfer member 37. In the present embodiment, the insertion member 43 is inserted from a rear side of the bottom portion of the imaging apparatus 10 and in contact with the first heat transfer member 37. Or, the insertion member 43, instead of (or in addition to) being inserted from the bottom portion, may be inserted into the thin portion 13a on the lateral side portion of the imaging apparatus 10. The number of, and an insertion position of, the insertion member 43 are not limited, and the insertion member 43 may be used as an adjustment member for obtaining a desired heat dissipation effect of the imaging apparatus 10. Also, the insertion member 43 may be inserted (e.g. in a screw-like manner or the like) into the first heat transfer member 37. For example, a mounting screw for mounting the imaging apparatus 10 on the vehicle 1 may be used as the insertion member 43, through which the heat dissipation (heat transfer) occurs from the imaging apparatus 10 to the vehicle 1. Note that, when the insertion member 43 is provided, in order to maintain the sealing properties of the housing 11, a structure to seal a periphery of the insertion member 43 (e.g. a structure to seal with the packing, an adhesive, or the like) may be adopted.

The heat transfer unit 44 has the heat conductivity and insulating properties, and is connected to the plurality of terminals 41 so as to transfer the heat generated from the image sensor 31 and the like to the plurality of terminals 41. Having the insulating properties, the heat transfer unit 44 does not cause a problem such as a short circuit and the like when connected to the plurality of terminals 41. In the present embodiment, the heat transfer unit 44 is composed of the internal heat transfer member 39 and a sealing member 42.

Here, the internal heat transfer member 39 has the heat conductivity and the insulating properties and is disposed in the housing 11 and connected to the plurality of terminals 41. In the present embodiment, the internal heat transfer member 39 transfers the heat from the image sensor 31 and the like received via the second heat transfer member 38 to the plurality of terminals 41.

The sealing member 42 is a member for sealing between the signal connection unit 40 and the housing 11. In the present embodiment, the sealing member 42 has the heat conductivity and the insulating properties and is connected to a portion of the first heat transfer member 37 which is exposed to the outside in the bottom portion of the housing 11. Also, the sealing member 42 is connected to the plurality of terminals 41 and transfers the heat generated from the image sensor 31 and the like thereto. Having the insulating properties, the sealing member 42 does not cause the problem such as the short circuit and the like when connected to the plurality of terminals 41.

With the configuration described above, the imaging apparatus 10 of the present embodiment has the following effects. First, since the imaging apparatus 10 includes the heat transfer unit 44 having the insulating properties and transferring the heat generated from the image sensor 31 and the like to the plurality of terminals 41, the heat inside the housing 11 transferred to the first heat transfer member 37 may be dissipated to the outside. Typically, the terminal of the imaging apparatus is made of metal having high heat conductivity. Therefore, by dissipating the heat inside the housing 11 to the outside with the plurality of terminals 41 having high heat conductivity, the imaging apparatus 10 may further enhance the heat dissipation effect.

Also, since the imaging apparatus 10 includes the first heat transfer member 37 which transfers the heat to the heat transfer unit 44 and is integrally formed with the inner wall of the housing 11, the temperature gradient may be generated within the housing 11. Therefore, heat accumulation in the imaging optical system 20 may be effectively suppressed, suppressing deterioration of performance of the imaging optical system 20 due to temperature rise.

In the present embodiment, here, the first heat transfer member 37 is made of metal such as, for example, aluminum, copper, and the like but not limited thereto. In the present embodiment, as integral molding, insert molding for integrating the metal and resin is performed. Here, the first heat transfer member 37 is not limited to the metal as long as having better heat conductivity than the resin member of the housing 11. That is, as a material of the first heat transfer member 37, a resin with better heat conductivity than the resin member of the housing 11 may be used. In this case, as the integral molding, two-color molding for integrating two different types of resins is performed. That is, the integral molding means integral molding of materials with different heat conductivity and includes the two-color molding as well as the insert molding.

Also, since the imaging apparatus 10 has the heat transfer unit 44 which includes the sealing member 42 having the function to transfer the heat to the plurality of terminals 41, the heat dissipation effect from the inside of the housing 11 to the outside may be further enhanced. The sealing member 42 may be provided from the outside of the housing 11 and readily processed. A material of the sealing member 42 may be a resin such as, for example, silicone, epoxy, or the like but is not limited thereto.

Here, for connection to the sealing member 42, the housing 11 needs an opening (hereinafter, referred to as a connection hole) for exposing the first heat transfer member 37 to the outside. In the present embodiment, the insert molding is performed as the integral molding, during which an opening for fixing the first heat transfer member 37 made of metal is formed. Since this opening required to perform the molding may be used as the connection hole, in the present embodiment a separate connection hole does not need to be prepared, and therefore manufacturing process of the imaging apparatus 10 is not increased.

Also, since the imaging apparatus 10 has the heat transfer unit 44 which includes the internal heat transfer member 39, the heat inside the housing 11 transferred to the first heat transfer member 37 and the second heat transfer member 38 is transferred to the plurality of terminals 41, thereby further enhancing the heat dissipation effect. Note that the internal heat transfer member 39 may be constituted by using, for example, a heat transfer sheet made of silicone, or may be made by performing heat transfer potting or the like, but is not limited thereto.

Also, the housing 11 of the imaging apparatus 10 forms the sealing structure. In this case, the imaging apparatus 10 has waterproof properties and dustproof properties (also referred to as sealing performance) at a joint portion. Further, in the imaging apparatus 10 of the present embodiment, since the image sensor 31 is arranged at the image-forming position of the imaging optical system 20 and integrally packaged, a user does not need to adjust the positional relationship between the image sensor 31 and the imaging optical system 20. Therefore, stable optical performance and image quality may be provided.

Also, the imaging apparatus 10 includes the second heat transfer member 38 for transferring the heat to the internal heat transfer member 39 and the first heat transfer member 37. With the second heat transfer member 38, the heat may be efficiently and reliably transferred from a heat source, i.e., the image sensor 31 and the electronic components 32a, 32b, and 33a to the internal heat transfer member 39 and the first heat transfer member 37. In the present embodiment, here, the heat transfer sheets 38a and 38b are made of silicone. Also, the heat transfer plate 38c is made of metal for transferring the heat in a further distance in comparison to the heat transfer sheets 38a and 38b. The metal of the heat transfer plate 38c may be, for example, aluminum, nickel silver, copper, or the like. The second heat transfer member 38, as described in the present embodiment, may be constituted by using a combination of members having different heat conductivity depending on a heat transfer distance. Further, although in the present embodiment the second heat transfer member 38 is constituted by using a combination of the two heat transfer sheets 38a and 38b and one heat transfer plate 38c, the second heat transfer member 38 is not limited thereto. For example, the second heat transfer member constituted by using the heat transfer sheet alone may be used.

In the present embodiment, also, in the inner wall of the housing 11 of the imaging apparatus 10, since the first heat transfer member 37 extends from the second circuit board 33 into the direction remote from the imaging optical system 20 (i.e., a rearward direction), the first heat transfer member 37 may collect the heat generated from at least one of the image sensor 31 and the electronic components 32a, 32b, and 33c and generate the temperature gradient within the housing 11. Therefore, the heat accumulation in the imaging optical system 20 may be effectively suppressed, suppressing the deterioration of the performance of the imaging optical system 20 due to the temperature rise.

Here, the housing 11 of the imaging apparatus 10 of the present embodiment is formed by using the resin member. If metal, instead of the resin, is the material used to form the housing 11 in its entirety, the heat dissipation properties is better than the resin, possibly suppressing the deterioration of the performance of the imaging optical system 20 due to the temperature rise. However, it becomes difficult to maintain the waterproof properties similar to that of the resin. In the imaging apparatus 10, the resin member may be used for the housing 11 and thus may maintain the waterproof properties.

Also, the imaging apparatus 10 includes the thin portion 13a where the first heat transfer member 37 is integrally formed. The resin member in the thin portion 13a is thin and thus has higher heat dissipation properties than other portions. The first heat transfer member 37 collecting the heat from the image sensor 31 and the like may dissipate the heat from the thin portion 13a having relatively high heat dissipation properties to the outside of the housing 11. Therefore, the imaging apparatus 10 may suppress the temperature rise inside the housing 11, preventing deterioration of the performance of the imaging optical system 20. Here, the resin member of the imaging apparatus 10 is thin in the thin portion 13a alone. The imaging apparatus 10 secures a necessary thickness of the resin member for providing the packing P for the purpose of waterproof at the joint portion between the front casing 12 and the rear casing 13, and thus is capable of maintaining the waterproof properties. Also, the thin portion 13a allows the portion having the first heat transfer member 37 integrally formed therewith to avoid becoming thick. Therefore, a situation that the space inside housing 11 becomes small as much as a volume of the first heat transfer member 37 may be avoided, and thus such a structure is particularly suitable for the imaging apparatus 10 small in size.

Also, the imaging apparatus 10 includes the second heat transfer member 38 for transferring the heat to the first heat transfer member 37. The second heat transfer member 38 may effectively and reliably transfer the heat from the heat source, i.e., the image sensor 31 and the electronic components 32a, 32b, and 33a to the first heat transfer member 37 and generate the temperature gradient.

Also, since the imaging apparatus 10 has the heat conductivity and the insulating properties and includes the sealing member 42 connecting to the portion of the first heat transfer member 37 exposed to the outside of the housing 11 and also connecting to the plurality of terminals 41, the heat inside the housing 11 transferred to the first heat transfer member 37 may be dissipated to the outside. Accordingly, the imaging apparatus 10 may enhance the heat dissipation effect. The sealing member 42 also has a function to transfer heat to the plurality of terminals 41 and thus further enhances the heat dissipation effect from the inside of the housing 11 to the outside. Typically, the terminal of the imaging apparatus is made of metal having high heat conductivity. Therefore, dissipation of the heat inside the housing 11 to the outside by use of a plurality of terminals having high heat conductivity may further enhance the heat dissipation effect. Further, the sealing member 42 may be provided from the outside of the housing 11 and readily processed. The material of the sealing member 42 may be, for example, the resin such as silicone, epoxy, and the like but is not limited thereto.

Further, since the imaging apparatus 10 includes the insertion member 43, the heat in the housing 11 transferred to the first heat transfer member 37 is further dissipated to the outside. Having the insertion member 43, the imaging apparatus 10 may further enhance the heat dissipation effect. The insertion member 43 needs to have the heat conductivity alone and, for example, a metal screw or the like may be used as the insertion member 43.

Here, a position to provide the first the heat transfer member 37 will be examined. Generally, the number of circuit boards of the imaging apparatus is not limited to two. Also, the first heat transfer member only needs to be integrally formed with the inner wall of the housing 11 in such a manner as to extend from any one of the circuit boards into the direction remote from the imaging optical system 20. When the first heat transfer member 37 is integrally formed in such a manner as to extend from a circuit board (the second circuit board 33 in the present embodiment) which is farthest from the imaging optical system 20, it may be expected to obtain the highest effect of suppressing the deterioration of the performance of the imaging optical system 20 due to the temperature rise. Or, when the first heat transfer member 37 is integrally formed in such a manner as to extend from a circuit board (the first circuit board 32 in the present embodiment) which is the closest to the imaging optical system 20, it may be expected to obtain the highest heat dissipation effect from the thin portion. Or, depending on necessary heat dissipation effect from the thin portion, the first heat transfer member 37 may be integrally formed in such a manner as to extend from an intermediate position of these circuit boards.

Although the disclosure herein has been described based on the figures and the embodiment, it is to be understood that various modifications and changes may be implemented based on the disclosure herein by those who are ordinarily skilled in the art. Accordingly, such modifications and changes are included in the scope of the disclosure herein. For example, functions and the like included in each means, step, and the like may be rearranged without logical inconsistency, so as to combine a plurality of means or steps together or to separate them.

REFERENCE SIGNS LIST

1 vehicle
10 imaging apparatus
11 housing
12 front casing
12*a* support opening
13 rear casing
13*a* thin portion
20 imaging optical system
22 retainer member
31 image sensor
32 first circuit board
32*a*, 32*b* electronic component
33 second circuit board
33*a* electronic component
37 first heat transfer member
38 second heat transfer member
38*a*, 38*b* heat transfer sheet
38*c* heat transfer plate
39 internal heat transfer member
40 signal connection unit
41 terminal
42 sealing member
43 insertion member
44 heat transfer unit
50 display apparatus

The invention claimed is:

1. An imaging apparatus comprising:
   an imaging optical system;
   an image sensor;
   a plurality of circuit boards including a first circuit board the image sensor and a first electronic component are mounted thereon;
   a housing including an opening that exposes the imaging optical system to a subject, the housing that supports the imaging optical system, the image sensor, and the plurality of circuit boards;
   signal terminals that transmit an image signal of the subject image captured by the image sensor to an outside of the housing;
   a heat transfer unit located in an interior of the housing having insulating properties and directly connected to the signal terminals, the heat transfer unit that transfers heat generated from at least one of the image sensor and the first electronic component to the signal terminals, and
   a heat transfer member comprising a heat transfer plate, a first planar heat transfer sheet and a second planar heat transfer sheet, the first and second planar heat transfer sheets being disposed directly on opposite main surfaces of the heat transfer plate, wherein
   the heat transfer plate is in contact with the heat transfer unit,
   the first planar heat transfer sheet is in contact with the first electronic component,
   the second planar heat transfer sheet is in contact with a second electronic component included on a second circuit board other than the first circuit board including the first electronic component, and
   a surface where the second electronic component is mounted faces a surface where the first electronic component is mounted.

2. The imaging apparatus according to claim 1, wherein the housing includes an inner wall comprising a first heat transfer member integrally disposed therewith, the first heat transfer member for transferring the heat to the heat transfer unit.

3. The imaging apparatus according to claim 2, wherein the heat transfer unit includes a sealing member having heat conductivity connected to a portion of the first heat transfer member exposed to an outside of the housing and also connected to the signal terminals, the sealing member that seals between the signal terminals and the housing.

4. The imaging apparatus according to claim 1, wherein the heat transfer unit includes an internal heat transfer member disposed inside the housing and connected to the signal terminals.

5. The imaging apparatus according to claim 1, wherein the housing forms a sealing structure.

6. An imaging apparatus comprising:
an imaging optical system;
an image sensor;
a plurality of circuit boards including a first circuit board the image sensor and a first electronic component mounted thereon; and
a housing including an opening that exposes the imaging optical system to a subject, the housing that supports the imaging optical system, the image sensor, and the plurality of circuit boards, wherein
a first heat transfer member is integrally disposed with an inner wall of the housing, and comprises a portion being longitudinal in an optical axis direction of the imaging optical system, and a radial portion directly connected to the longitudinal portion that extends in direction radially inward when viewed in a cross section of the optical axis, such that the longitudinal portion extends in a direction away from the radial portion and towards the imaging optical system, and
the imaging apparatus further comprises a second heat transfer member comprising a heat transfer plate, a first planar heat transfer sheet, and a second planar heat transfer sheet, the first and second planar heat transfer sheets being disposed directly on opposite main surfaces of the heat transfer plate, wherein
the heat transfer plate is in contact with the first heat transfer member,
the first planar heat transfer sheet is in contact with the first electronic component,
the second planar heat transfer sheet is in contact with a second electronic component included in a second circuit board other than the first circuit board including the first electronic component, and
a surface where the second electronic component is mounted faces a surface where the first electronic component is mounted.

7. The imaging apparatus according to claim 6, wherein, in the housing,
the first heat transfer member and a resin member are integrally disposed together, and
a thickness of the resin member in a portion having the first heat transfer member integrally disposed therewith is smaller than that in a portion where the first heat transfer member is not integrally formed therewith.

8. The imaging apparatus according to claim 6, wherein the second heat transfer member transfers the heat generated from at least one of the image sensor and the first electronic component to the first heat transfer member.

9. The imaging apparatus according to claim 6, wherein the housing forms a sealing structure.

10. The imaging apparatus according to claim 6, further comprising signal terminals that transmit an image signal of the subject image captured by the image sensor to an outside of the housing; and
a sealing member having heat conductivity and connected to a portion of the first heat transfer member exposed to the outside of the housing, the sealing member that seals between the signal terminals and the housing.

11. The imaging apparatus according to claim 6, further comprising an insertion member having heat conductivity, inserted from the outside of the housing, and connected to a portion of the first heat transfer member.

12. A vehicle having an imaging apparatus mounted thereon, the imaging apparatus including an imaging optical system, an image sensor, a plurality of circuit boards including a first circuit board the image sensor and a first electronic component mounted thereon, and a housing including an opening that exposes the imaging optical system to a subject, the housing that supports the imaging optical system, the image sensor, and the plurality of circuit boards, wherein
a first heat transfer member is integrally disposed with an inner wall of the housing, and comprises a portion being longitudinal in an optical axis direction of the imaging optical system, and a radial portion directly connected to the longitudinal portion that extends in direction radially inward when viewed in a cross section of the optical axis, such that the longitudinal portion extends in a direction away from the radial portion and towards the imaging optical system, and
the imaging apparatus further comprises a second heat transfer member comprising a heat transfer plate, a first planar heat transfer sheet, and a second planar heat transfer sheet, the first and second planar heat transfer sheets being disposed directly on opposite main surfaces of the heat transfer plate, wherein
the heat transfer plate is in contact with the first heat transfer member,
the first planar heat transfer sheet is in contact with the first electronic component,
the second planar heat transfer sheet is in contact with a second electronic component included in a second circuit board other than the first circuit board including the first electronic component, and
a surface where the second electronic component is mounted faces a surface where the first electronic component is mounted.

13. The imaging apparatus according to claim 1, wherein the first circuit board, the first electronic component, the heat transfer member, the second electronic component, and the second circuit board, are arranged in this order on an interior of the housing.

14. The imaging apparatus according to claim 6, wherein the first circuit board, the first electronic component, the second heat transfer member, the second electronic component, and the second circuit board, are arranged in this order on an interior of the housing.

15. The vehicle of claim 12, wherein the first circuit board, the first electronic component, the second heat transfer member, the second electronic component, and the second circuit board, are arranged in this order on an interior of the housing.

* * * * *